United States Patent
Ooyabu et al.

(10) Patent No.: US 8,327,535 B2
(45) Date of Patent: Dec. 11, 2012

(54) WIRED CIRCUIT BOARD AND PRODUCING METHOD THEREOF

(75) Inventors: Yasunari Ooyabu, Osaka (JP); Jun Ishii, Osaka (JP); Kensuke Nishi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/317,108

(22) Filed: Oct. 11, 2011

(65) Prior Publication Data

US 2012/0030939 A1 Feb. 9, 2012

Related U.S. Application Data

(62) Division of application No. 11/898,503, filed on Sep. 12, 2007, now Pat. No. 8,063,312.

(60) Provisional application No. 60/906,822, filed on Mar. 14, 2007.

(30) Foreign Application Priority Data

Sep. 27, 2006 (JP) .................................. 2006-262817

(51) Int. Cl.
*H05K 3/10* (2006.01)

(52) U.S. Cl. ........................................................ 29/852

(58) Field of Classification Search ............. 29/846–853
See application file for complete search history.

(56) References Cited

U.S. PATENT DOCUMENTS

| | | | |
|---|---|---|---|
| 6,515,222 B2 * | 2/2003 | Underwood et al. | 174/394 |
| 7,495,178 B2 * | 2/2009 | Ishii et al. | 174/255 |
| 2004/0245619 A1 | 12/2004 | Takeuchi et al. | |
| 2004/0252413 A1 | 12/2004 | Nishiyama | |
| 2005/0061542 A1 * | 3/2005 | Aonuma et al. | 174/255 |
| 2005/0247481 A1 | 11/2005 | Chen et al. | |

FOREIGN PATENT DOCUMENTS

| | | |
|---|---|---|
| JP | 02-198186 | 8/1990 |
| JP | 2000-097983 | 4/2000 |
| JP | 2005-11387 | 1/2005 |
| JP | 2006-024878 | 1/2006 |
| JP | 2006-245122 | 9/2006 |

* cited by examiner

*Primary Examiner* — Jeremy Norris
(74) *Attorney, Agent, or Firm* — Jean C. Edwards, Esq.; Edwards Neils PLLC

(57) ABSTRACT

A wired circuit board has a metal supporting board, a metal foil formed on the metal supporting board, an insulating base layer formed on the metal supporting board to cover the metal foil, and a conductive pattern formed on the insulating base layer and a having a terminal portion. An opening is formed in the insulating base layer to expose the metal foil.

3 Claims, 5 Drawing Sheets

WIRED CIRCUIT BOARD AND PRODUCING METHOD THEREOF

CROSS REFERENCE TO RELATED APPLICATION

This application is a divisional patent application of U.S. patent application Ser. No. 11/898,503, filed on Sep. 12, 2007 now U.S. Pat. No. 8,063,312, which claims the benefit of U.S. Provisional Application No. 60/906,822, filed Mar. 14, 2007, and claims priority from Japanese Patent Application No. 2006-262817, filed Sep. 27, 2006, the contents of all of which are herein incorporated by reference in their entirety.

BACKGROUND OF THE INVENTION

1. Field of the Invention

The present invention relates to a wired circuit board and a producing method thereof and, more particularly, to a wired circuit board such as a suspension board with circuit and a producing method thereof.

2. Description of the Related Art

There has been conventionally known a suspension board with circuit including a metal supporting board made of stainless steel, an insulating layer made of a polyimide resin formed thereon, and a conductive pattern made of copper formed thereon.

In recent years, in terms of higher data density, an increase in the frequency of a signal has been required in such a suspension board with circuit. However, when the frequency of the signal is increased, a transmission loss increases undesirably in the conductive pattern.

To reduce such a transmission loss, there has been proposed a transmission line which includes, e.g., a lower insulating layer formed on a stainless steel layer, a lower conductor formed on the lower insulating layer, an upper insulating layer formed on the lower conductor, and conductors composed of a record-side line and a reproduction-side line which are formed on the upper insulating layer (see, e.g., Japanese Unexamined Patent Publication No. 2005-11387).

SUMMARY OF THE INVENTION

However, in the transmission line proposed in Japanese Unexamined Patent Publication No. 2005-11387, when a pin hole or the like is formed in the upper insulating layer formed under the conductors and extends therethrough in the thickness direction, the conductor may be filled in the pin hole to provide conduction between the corresponding conductor and the lower conductor. In such a case, the electric properties of the conductor are undesirably changed by the conduction with the lower conductor. When the pin hole is formed in the upper insulating layer formed under the record-side line and another pin hole is formed also in the upper insulating layer formed under the reproduction-side line, the problem of a short circuit between the record-side line and the reproduction-side line via the lower conductor occurs in addition to the problem mentioned above.

To prevent the problems, it is necessary to screen out such a wired circuit board with conduction between the conductor and the lower conductor as a defective product. However, it is difficult to inspect such conduction between the conductor and the lower conductor.

It is therefore an object of the present invention to provide a wired circuit board which allows easy inspection of conduction between a metal foil and a conductive pattern and a producing method thereof.

A wired circuit board according to the present invention comprises a metal supporting board, a metal foil formed on the metal supporting board, an insulating base layer formed on the metal supporting board to cover the metal foil, and a conductive pattern formed on the insulating base layer and having a terminal portion, wherein an opening is formed in the insulating base layer to expose the metal foil.

In the wired circuit board, the metal foil is exposed from the opening of the insulating base layer. Therefore, when the electrolytic plating layer is formed on the surface of the terminal portion by electrolytic plating for causing conduction in the conductive pattern, the electrolytic plating layer is also formed on the surface of the metal foil exposed from the opening of the insulating base layer in the case of conduction between the metal foil and the conductive pattern. In the case of no conduction between the metal foil and the conductive pattern, the electrolytic plating layer is not formed on the surface of the metal foil exposed from the opening of the insulating base layer. As a result, by determining whether or not the electrolytic plating layer is formed on the surface of the metal foil exposed from the opening, conduction between the metal foil and the conductive pattern can be inspected.

This allows easy and reliable screening of a defective product by inspecting conduction between the metal foil and the conductive pattern in the obtained wired circuit board after the electrolytic plating.

It is preferable that the wired circuit board according to the present invention further comprises an insulating cover layer formed on the insulating base layer to cover the conductive pattern and expose the terminal portion and the metal foil exposed from the opening and an electrolytic plating layer formed on a surface of the terminal portion.

In the wired circuit board, the electrolytic plating layer is formed on the surface of the terminal portion exposed from the insulating cover layer. As a result, by determining whether or not the electrolytic plating layer is formed on the surface of the metal foil exposed from the opening of the insulating base layer, conduction between the metal foil and the conductive pattern can be inspected.

This allows easy and reliable screening of a defective product by inspecting conduction between the metal foil and the conductive pattern in the obtained wired circuit board.

It is preferable that the wired circuit board according to the present invention further comprises a main body portion in which the terminal portion is provided and a removal portion which can be removed from the main body portion, wherein the opening is formed in the removal portion.

In the wired circuit board, the removal portion in which the opening is formed can be removed from the main body portion in which the terminal portion is provided. As a result, when the wired circuit board is a non-defective product, there may be a case where the electrolytic plating layer is not formed in the opening of the insulating base layer and the metal foil is exposed from the opening of the insulating base layer to possibly cause the corrosion of the metal foil. Even in such a case, the possibility of the corrosion of the metal foil can be avoided by removing the removal portion from the main body portion.

As a result, it is possible to ensure the excellent long-term reliability of the wired circuit board determined as a non-defective product.

A method for producing a wired circuit board according to the present invention comprises the steps of preparing a metal supporting board, forming a metal foil on the metal supporting board, forming an insulating base layer on the metal supporting board to cover the metal foil, forming an opening in the insulating base layer to expose the metal foil, forming a conductive pattern having a terminal portion on the insulating base layer, forming an electrolytic plating layer on a surface of the terminal portion by electrolytic plating, and, determining whether or not the electrolytic plating layer is formed on a surface of the metal foil exposed from the opening after forming the electrolytic plating layer to inspect conduction between the metal foil and the conductive pattern.

In the method for producing the wired circuit board, the electrolytic plating layer is formed on the surface of the terminal portion by electrolytic plating. Accordingly, in the case of conduction between the metal foil and the conductive pattern, the electrolytic plating layer is formed also on the surface of the metal foil exposed from the opening of the insulating base layer. In the case of no conduction between the metal foil and the conductive pattern, the electrolytic plating layer is not formed on the surface of the metal foil exposed from the opening of the insulating base layer. Since conduction between the metal foil and the conductive pattern is inspected by forming the electrolytic plating layer on the surface of the terminal portion and then determining whether or not the electrolytic plating layer is formed on the surface of the metal foil exposed from the opening, a defective product can be screened out easily and reliably.

In the method for producing a wired circuit board, the electrolytic plating layer is formed on the surface of the terminal portion and, in the case of conduction between the metal foil and the conductive pattern, the electrolytic plating layer is formed also on the surface of the metal foil exposed from the opening. As a result, the electrolytic plating layer on the surface of the terminal portion and the electrolytic plating layer for inspection formed on the surface of the metal foil exposed from the opening of the case of conduction between the metal foil and the conductive pattern can be formed simultaneously in one step. This allows easy production of the wired circuit board, while inspecting conduction between the metal foil and the conductive pattern.

It is preferable that the method for producing a wired circuit board further comprises the step of forming an insulating cover layer on the insulating base layer to cover the conductive pattern and expose the terminal portion and the metal foil exposed from the opening.

In the method for producing a wired circuit board, the electrolytic plating layer can be reliably formed on the surface of the terminal portion and, in the case of conduction between the metal foil and the conductive pattern, the electrolytic plating layer can be formed reliably on the surface of the metal foil exposed from the opening.

It is preferable that the method for producing a wired circuit board further comprises the step of forming a perforation between a main body portion in which the terminal portion is provided and a removal portion which can be removed from the main body portion and in which the opening is formed.

In the method for producing a wired circuit board, the removal portion in which the opening is formed can be removed along the perforation from the main body portion in which the terminal portion is provided. Accordingly, when the wired circuit board is a non-defective product, there may be a case where the electrolytic plating layer is not formed in the opening of the insulating base layer and the metal foil is exposed from the opening of the insulating base layer to possibly cause the corrosion of the metal foil. Even in such a case, the possibility of such corrosion of the metal foil can be avoided by removing the removal portion from the main body portion.

As a result, a wired circuit board can be obtained that is determined as a non-defective product having excellent in long-term reliability.

DETAILED DESCRIPTION OF THE INVENTION

Figure 1:
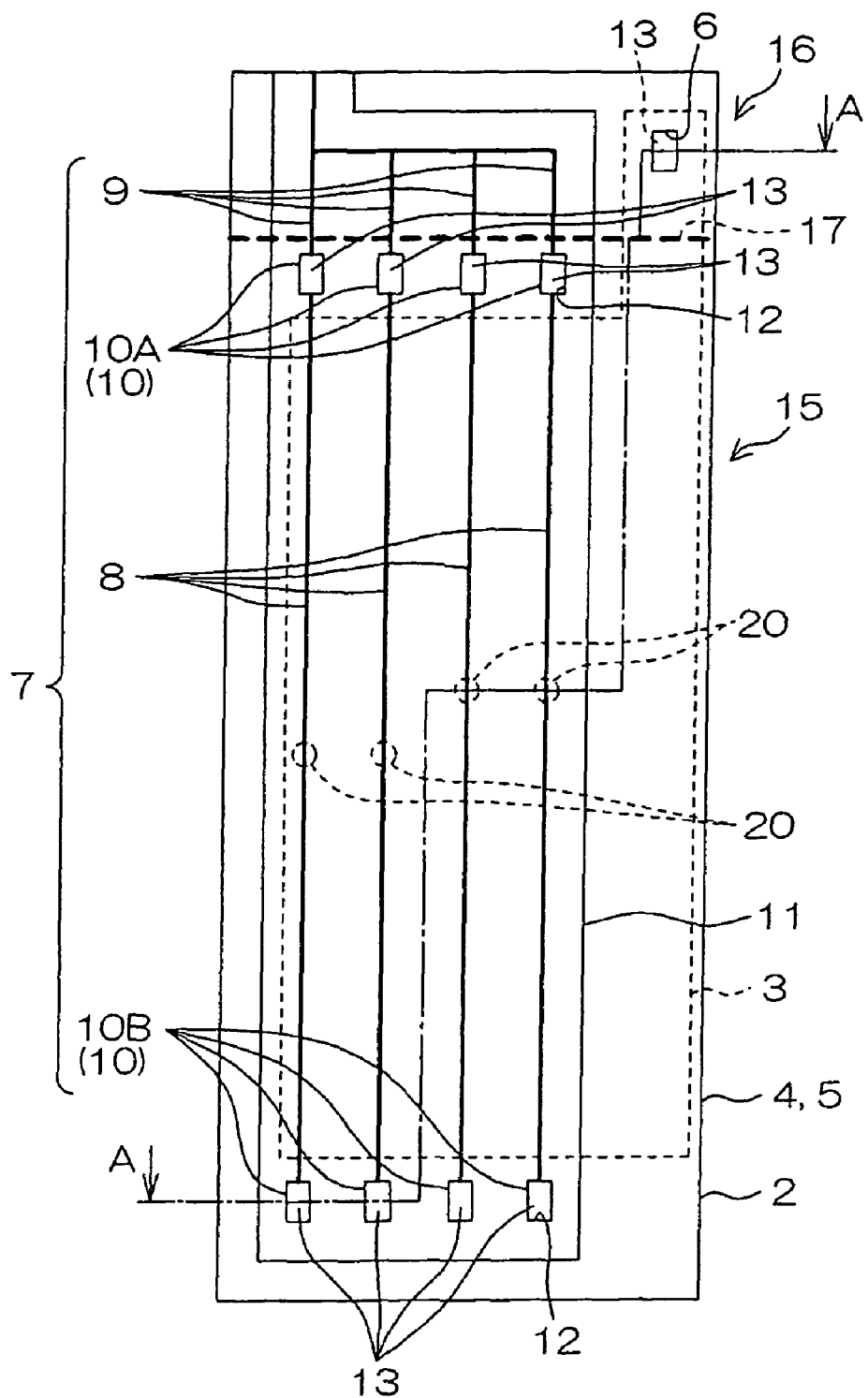
FIG. 1 is a plan view of a wired circuit board according to an embodiment of the present invention.
Figure 2:
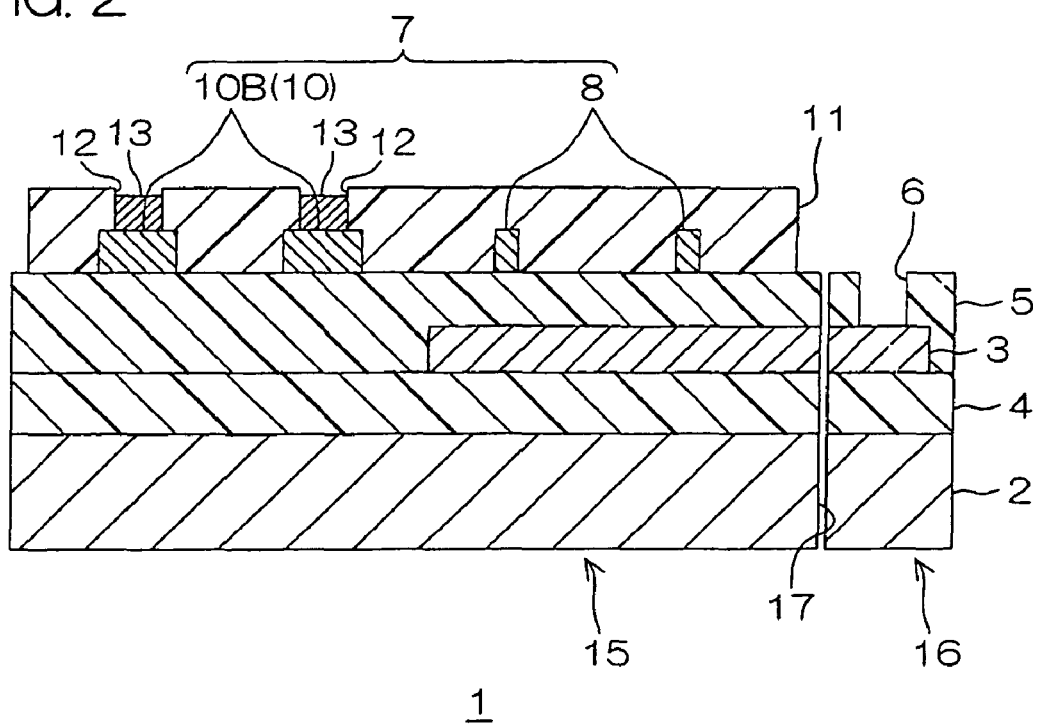
FIG. 2 is a cross-sectional view taken along the line A-A of the wired circuit board shown in FIG. 1, which is determined as a non-defective product.
Figure 3:
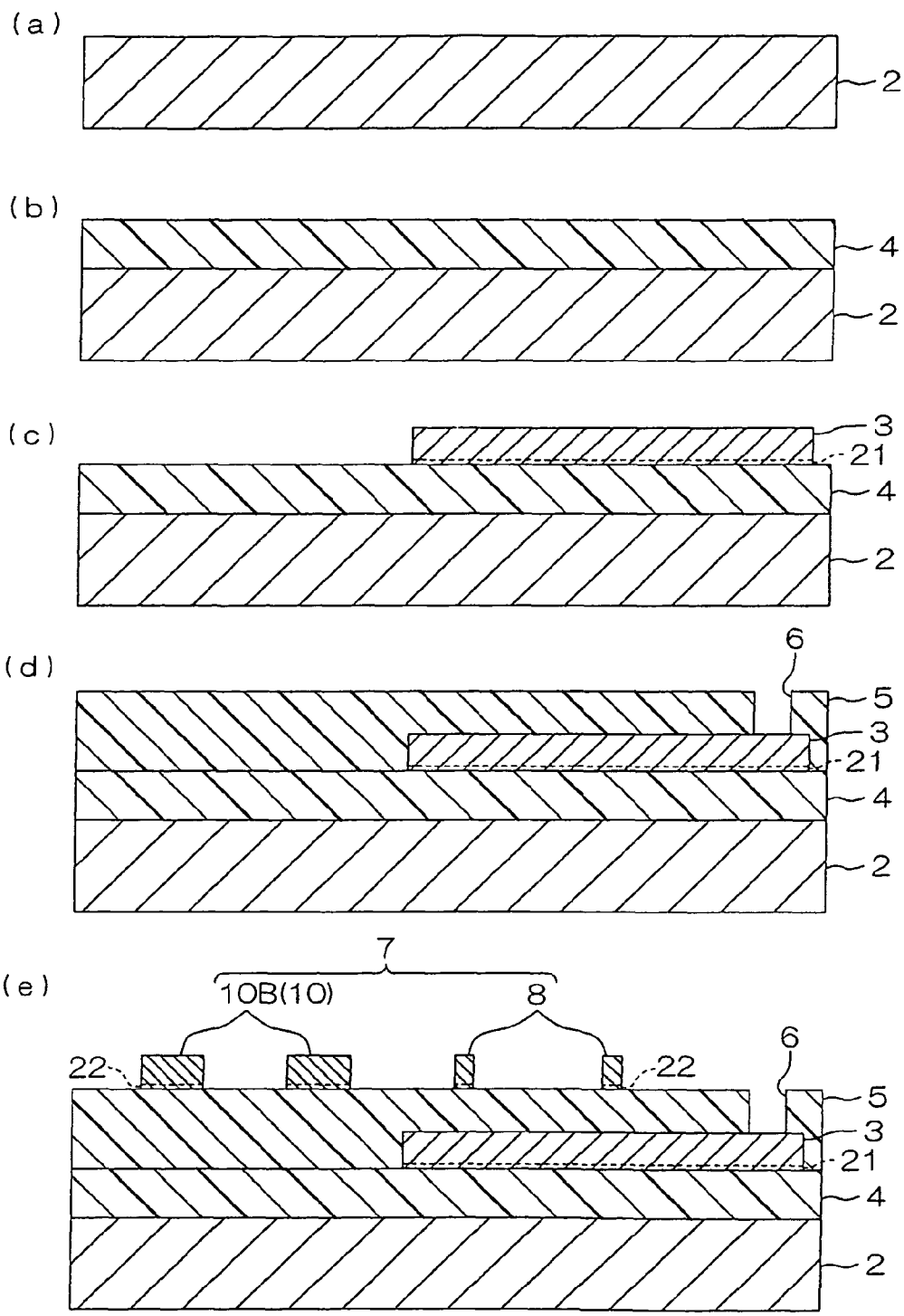
FIG. 3 is a process step view showing a method for producing the wired circuit board shown in FIG. 2, (a) showing the step of preparing a metal supporting board, (b) showing the step of forming a first insulating base layer on the upper surface of the metal supporting board, (c) showing the step of forming a metal foil on the upper surface of the first insulating base layer, (d) showing the step of forming a second insulating layer on the upper surface of the first insulating base layer to cover the metal foil and form a base opening for exposing the metal foil, and (e) showing the step of forming a conductive pattern having wires, terminal portions, and plating leads on the upper surface of the second insulating base layer.
Figure 4:
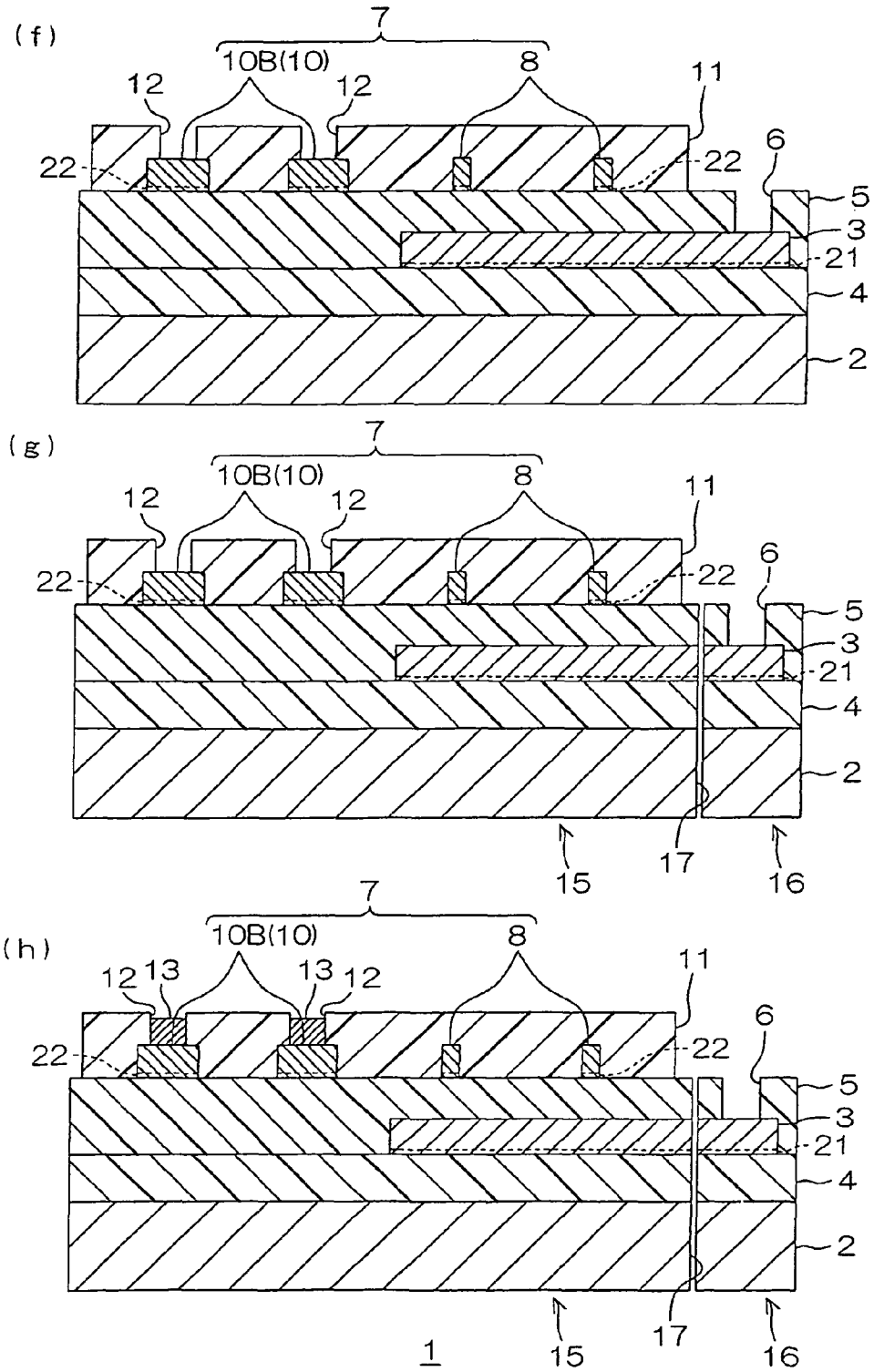
FIG. 4 is a process step view showing the method for producing the wired circuit board shown in FIG. 2, subsequently to FIG. 3, (f) showing the step of forming an insulating cover layer on the upper surface of the second insulating base layer to cover the conductive pattern and form cover openings for exposing the terminal portions, (g) showing the step of forming a perforation, and (h) showing the step of forming an electrolytic plating layer on the surface of each of the terminal portions by electrolytic plating.
Figure 5:
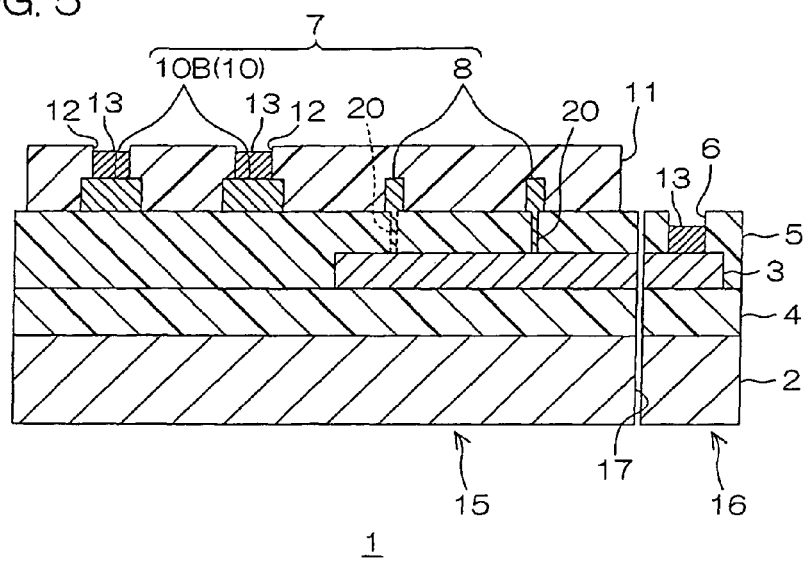
FIG. 5 is a cross-sectional view taken along the A-A of the wired circuit board shown in FIG. 1, which is determined as a defective product.

FIG. 1 is a plan view of a wired circuit board according to an embodiment of the present invention. FIG. 2 is a cross-sectional view taken along the line A-A of the wired circuit board shown in FIG. 1, which is determined as a non-defective product. FIGS. 3 and 4 are process step views showing a method for producing the wired circuit board shown in FIG. 2. FIG. 5 is a cross-sectional view taken along the A-A of the wired circuit board shown in FIG. 1, which is determined as a defective product.

In FIG. 1, a wired circuit board 1 is a suspension board with circuit mounted on a hard disk drive or the like, which is formed to extend in a longitudinal direction. The wired circuit board 1 includes a main body portion 15 formed in a generally rectangular plan shape when viewed in plan view and positioned on one longitudinal side and a removal portion 16 formed in a generally rectangular plan shape when viewed in plan view and positioned on the other longitudinal side. The wired circuit board 1 has a perforation 17 provided between the main body portion 15 and the removal portion 16.

The main body portion 15 integrally includes a plurality of (four) wires 8 arranged in mutually spaced-apart relation to extend in the longitudinal direction, magnetic-head-side connection terminal portions 10A as terminal portions provided on the respective one longitudinal end portions of the wires 8, and external connection terminal portions 10B as the terminal portions provided on the respective other longitudinal end portions of the wires 8.

The wires 8 are arranged in mutually spaced-apart and parallel opposed relation in a widthwise direction (orthogonal direction to the longitudinal direction). The plurality of wires 8 are positioned in slightly displaced relation toward the other widthwise side (left-hand side) of the wired circuit board 1 to provide a margin portion on one widthwise side (right-hand side) of each of the main body portion 15 and removal portion 16 of the wired circuit board 1.

The width (widthwise length) of each of the wires 8 is in the range of, e.g., 10 to 100 µm, or preferably 20 to 50 µm. The spacing (widthwise spacing) between the individual wires 8 is in the range of, e.g., 10 to 100 µm, or preferably 20 to 50 µm.

The plurality of (four) magnetic-head-side connection terminal portions 10A are provided as wide quadrilateral lands which are arranged in parallel along the widthwise direction at the one longitudinal end portion of the main body portion 15. To the magnetic-head-side connection terminal portions 10A, the respective one longitudinal end portions of the wires 8 are connected. To the magnetic-head-side connection terminal portions 10A, terminal portions (not shown) of a magnetic head are connected after the production of the wired circuit board 1.

The plurality of (four) external connection terminal portions 10B are provided as wide quadrilateral lands which are arranged in parallel along the widthwise direction at the other longitudinal end portion of the main body portion 15. To the external connection terminal portions 10B, the respective other longitudinal end portions of the wires 8 are connected. To the external connection terminal portions 10B, terminal portions (not shown) of a read/write board are connected after the production of the wired circuit board 1.

The length of each of the magnetic-head-side connection terminal portions 10A and the external connection terminal portions 10B is in the range of, e.g., 20 to 1000 µm, or preferably 30 to 800 µm. The width of each of the magnetic-head-side connection terminal portions 10A and the external connection terminal portions 10B is in the range of, e.g., 20 to 1000 µm, or preferably 30 to 800 µm.

Each of the magnetic-head-side connection terminal portions 10A and the external connection terminal portions 10B is hereinafter simply described as a terminal portion 10 when distinction therebetween is not particularly needed.

The removal portion 16 is positioned in continuous and adjacent relation to the main body portion 15. The removal portion 16 includes plating leads 9.

The plurality of (four) plating leads 9 connected to the respective magnetic-head-side connection terminal portions 10A have one longitudinal end portions thereof integrated into a single plating lead 9 and connected to a plating lead connection terminal, though not shown.

The perforation 17 is provided linearly along the widthwise direction between the main body portion 15 and the removal portion 16. The removal portion 16 can be removed from the main body portion 15 along the perforation 17 serving as the boundary line. More specifically, the perforation 17 is formed as a series of perforated holes 17 along which a metal supporting board 2, a first insulating base layer 4, a metal foil 3, and a second insulating base layer 5, each described later, are intermittently removed, as shown in FIG. 2.

The width (longitudinal length) of the perforation 17 is in the range of, e.g., 40 to 100 µm, or preferably 40 to 80 µm. The length (widthwise length) of the perforation 17 is in the range of, e.g., 60 to 1000 µm, or preferably 80 to 240 µm. The widthwise spacing between the individual perforated holes 17 is in the range of, e.g., 40 to 960 µm, or preferably 80 to 120 µm.

The wired circuit board 1 includes a metal supporting board 2, a first insulating base layer 4 as an insulating base layer formed on the metal supporting board 2, a metal foil 3 formed on the first insulating base layer 4, and a second insulating base layer 5 as an insulating base layer formed to cover the metal foil 3. The wired circuit board 1 also includes a conductive pattern 7 formed on the second insulating base layer 5 and having the wires 8, the terminal portions 10, and the plating leads 9 (see FIG. 1). The wired circuit board 1 includes an insulating cover layer 11 formed on the second insulating base layer 5 to cover the conductive pattern 7 and expose the terminal portions 10 and the metal foil 3 exposed from a base opening 6 as an opening described later, and an electrolytic plating layer 13 formed on the surface of each of the terminal portions 10.

As shown in FIG. 1, the metal supporting board 2 is composed of a metal foil in the shape of a flat plate or a metal thin plate extending in the longitudinal direction to correspond to the outer shape of the wired circuit board 1 including the main body portion 15 and the removal portion 16. Examples of a metal material used to form the metal supporting board 2 include stainless steel, a 42-alloy and so on. Preferably, stainless steel is used. The thickness of the metal supporting board 2 is in the range of, e.g., 15 to 30 µm, or preferably 20 to 25 µm.

As shown in FIG. 2, the first insulating base layer 4 is formed on a surface of the metal supporting board 2. More specifically, the first insulating base layer 4 is formed on the upper surface of the metal supporting board 2 including the main body portion 15 and the removal portion 16. That is to say, the first insulating base layer 4 has a peripheral end edge thereof placed at the same portion as the peripheral end edge of the metal supporting board 2, when viewed in plan view.

Examples of an insulating material used to form the first insulating base layer 4 include synthetic resins such as polyimide, polyether nitrile, polyether sulfone, polyethylene terephthalate, polyethylene naphthalate, and polyvinyl chloride, each of which is typically used as an insulating material for a wired circuit board. Among them, a photosensitive synthetic resin is preferably used, or more preferably, photosensitive polyimide is used. The thickness of the first insulating base layer 4 is in the range of, e.g., 1 to 10 µm, or preferably 1 to 5 µm.

As shown in FIGS. 1 and 2, the metal foil 3 is formed in a pattern on the surface of the first insulating base layer 4 to oppose to the wires 8 in the thickness direction in the main body portion 15 and to oppose to the base opening 6 described later in the thickness direction in the removal portion 16.

In other words, the metal foil 3 is formed in the main body portion 15 to extend over both outermost wires 8 in the widthwise direction and to extend over the longitudinal inner vicinity of each of the magnetic-head-side connection terminal portions 10A and the longitudinal inner vicinity of each of the external connection terminal portions 10B in the longitudinal direction, as shown in FIG. 1.

The metal foil 3 is also formed to protrude toward the margin portion on one widthwise side (right-hand side) of the main body portion 15 of the wired circuit board 1. The protruding portion of the metal foil 3 positioned on the margin portion of the main body portion 15 further extends in one longitudinal direction to cross the perforation 17 and overlap the base opening 6 of the second insulating base layer 5 in the removal portion 16, when viewed in plan view.

Examples of a metal material used to form the metal foil 3 include copper, nickel, gold, a solder, tin, silver, and an alloy thereof. Preferably, copper is used. The thickness of the metal foil 3 is in the range of, e.g., 0.1 to 5 μm, or preferably 1 to 5 μm.

The second insulating base layer 5 is formed to extend over the main body portion 15 and the removal portion 16 and have a peripheral end edge thereof placed at the same position as the peripheral end edge of the metal supporting board 2, when viewed in plan view. The second insulating base layer 5 is also formed on the surface of the first insulating base layer 4 to cover the metal foil 3. In the second insulating base layer 5, the base opening 6 is provided to oppose to the protruding portion of the metal foil 3 in the removal portion 16. The base opening 6 is formed in a generally rectangular shape when viewed in plan view to expose the metal foil 3.

As an insulating material for forming the second insulating base layer 5, any of the same insulating materials is used as those used to form the first insulating base layer 4 mentioned above. Preferably, a photosensitive synthetic resin is used, or more preferably, photosensitive polyimide is used. The thickness of the second insulating base layer 5 is in the range of, e.g., 1 to 10 μm, or preferably 1 to 5 μm.

The length of the base opening 6 is in the range of, e.g., 40 to 1000 μm, or preferably 100 to 500 μm. The width of the base opening 6 is in the range of, e.g., 40 to 1000 μm, or preferably 100 to 500 μm.

The area of the base opening 6 is in the range of, e.g., 1600 to $1 \times 10^6$ μm$^2$, or preferably $1 \times 10^4$ to $2.5 \times 10^5$ μm$^2$. When the area of the base opening 6 is over the range shown above, the thickness of the electrolytic plating layer 13 for inspection formed on the surface of the metal foil 3 exposed from the base opening 6 is reduced in the case of conduction between the metal foil 3 and the conductive pattern 7. As a result, it may be difficult to inspect the formation of the electrolytic plating layer 13. When the area of the base opening 6 is under the range shown above, the electrolytic plating layer 13 for inspection formed on the surface of the metal foil 3 exposed from the base opening 6 becomes narrow and small in the case of conduction between the metal foil 3 and the conductive pattern 7. As a result, it may be difficult to inspect the formation of the electrolytic plating layer 13.

The conductive pattern 7 is formed as the foregoing pattern (wired circuit pattern) integrally including the wires 8, the terminal portions 10, and the metal leads 9 on the second insulating base layer 5.

Examples of a conductive material used to form the conductive pattern 7 include conductive material such as copper, nickel, gold, a solder, and an alloy thereof, each of which is typically used as a conductive material for a wired circuit board. Among them, copper is preferably used. The thickness of the conductive pattern 7 is in the range of, e.g., 5 to 20 μm, or preferably 7 to 15 μm.

The insulating cover layer 11 is formed on the surface of the second insulating base layer 5 to continuously cover the wires 8 and each of the plating leads 9 over the main body portion 15 and the removal portion 16 and to be longer than the conductive pattern 7 in each of the longitudinal and widthwise directions.

More specifically, the insulating cover layer 11 is formed to extend over both the outermost wires 8 in the widthwise direction. As a result, the insulating cover layer 11 is not formed on the margin portion in the widthwise direction and positioned in slightly displaced relation toward the other widthwise side (left-hand side) of the wired circuit board 1.

Consequently, the base opening 6 of the second insulating base layer 5 in the protruding portion of the metal foil 3 and the metal foil 3 exposed from the base opening 6 are exposed from the insulating cover layer 11.

In the insulating cover layer 11, cover openings 12 are each formed in a generally rectangular shape when viewed in plan view to expose the respective terminal portions 10.

To form the insulating cover layer 11, any of the same insulating materials is used as those used to form the first insulating base layer 4 mentioned above. Preferably, a photosensitive synthetic resin is used, or more preferably, photosensitive polyimide is used. The thickness of the insulating cover layer 11 is in the range of, e.g., 2 to 10 μm, or preferably 3 to 6 μm.

As shown in FIG. 2, the electrolytic plating layer 13 is filled in each of the cover openings 12 of the insulating cover layer 11. In other words, the electrolytic plating layer 13 is formed on the upper surface of the metal foil 3 exposed from each of the cover openings 12 of the insulating cover layer 11.

As shown in FIG. 5, the electrolytic plating layer 13 is also formed in the base opening 6 of the second insulating base layer 5 in the wired circuit board 1 determined as a defective product described later. Thus, such an electrolytic plating layer 13 is formed not only in each of the cover openings 12 described above but also on the upper surface of the metal foil 3 exposed from the base opening 6 of the second insulating base layer 5.

Examples of a metal material used to form the electrolytic plating layer 13 include gold, silver, nickel, and an alloy thereof. Preferably, gold is used.

The thickness of the electrolytic plating layer 13 (electrolytic plating layer 13 formed in each of the cover openings 12) is in the range of, e.g., 0.25 to 3.0 μm, or preferably 0.5 to 2.0 μm. The thickness of the electrolytic plating layer 13 (see FIG. 5) formed in the base opening 6 when the wired circuit board 1 is determined as a defective product is in the range of, e.g., 0.25 to 3.0 μm, or preferably 0.5 to 2.0 μm.

Next, a method for producing the wired circuit board 1 will be described with reference to FIGS. 3 and 4.

First, as shown in FIG. 3(*a*), the metal supporting board 2 is prepared in the method.

Next, as shown in FIG. 3(*b*), the first insulating base layer 4 is formed on the metal supporting board 2.

To form the first insulating base layer 4, a solution (varnish) of, e.g., the photosensitive synthetic resin mentioned above is uniformly coated on the upper surface of the metal supporting board 2, dried, exposed to light, developed, and then cured as necessary.

Alternatively, the first insulating base layer 4 may also be formed by coating a solution (varnish) of, e.g., the synthetic resin mentioned above, drying it, and then curing it as necessary. The formation of the first insulating base layer 4 is not particularly limited to the methods shown above. For example, it is also possible to preliminarily form a synthetic resin into a film in the foregoing pattern and then stick the film to the surface of the metal supporting board 2 via a known adhesive layer.

Next, as shown in FIG. 3(*c*), the metal foil 3 is formed on the first insulating base layer 4.

The metal foil 3 is formed in the foregoing pattern on the upper surface of the first insulating base layer 4 by, e.g., a patterning method such as an additive method or a subtractive method. Preferably, the metal foil 3 is formed by the additive method.

In the additive method, a first metal thin film 21 indicated by the dotted line is formed first on the upper surface of the first insulating base layer 4. The first metal thin film 21 is formed by sputtering, or preferably by laminating a chromium thin film and a copper thin film by chromium sputtering and copper sputtering.

Next, a plating resist not shown is formed in a pattern reverse to the foregoing pattern on the upper surface of the first metal thin film 21. Then, the metal foil 3 is formed in the foregoing pattern by electrolytic plating or electroless plating on the upper surface of the first metal thin film 21 exposed from the plating resist. Subsequently, the plating resist and the portion of the first metal thin film 21 where the plating resist is laminated are removed.

For electrolytic plating, a method is used in which, e.g., the wired circuit board 1 in a process of the production shown in FIG. 3(b) is dipped in a plating solution of any of the metals shown above and electrical conduction is caused in the first metal thin film 21 used as a seed film.

For electroless plating, a method is used in which, e.g., the wired circuit board 1 in the process of the production shown in FIG. 3(b) is dipped in a plating solution of any of the metals shown above.

Among them, electrolytic plating is preferably used to form the metal foil 3.

Next, as shown in FIG. 3(d), the second insulating base layer 5 is formed on the first insulating base layer 4 to cover the metal foil 3.

The second insulating base layer 5 is formed in a pattern having the base opening 6 by, e.g., uniformly coating a solution (varnish) of, e.g., the same photosensitive synthetic resin as that used to form the first insulating base layer 4 on the upper surface of the first insulating base layer 4 including the metal foil 3, drying it, exposing to it to light via a photomask, developing it, and then curing it as necessary.

The formation of the second insulating base layer 5 is not limited thereto. For example, it is also possible to preliminarily form a synthetic resin into a film in the foregoing pattern (pattern in which the base opening 6 is formed) and then stick the film to the upper surface of the first insulating base layer 4 via a known adhesive layer to cover the metal foil 3.

As a result, the second insulating base layer 5 and the base opening 6 can be formed simultaneously in one step.

Alternatively, it is also possible to form the second insulating base layer 5 first by, e.g., uniformly coating a solution (varnish) of the synthetic resin mentioned above on the upper surface of the first insulating base layer 4 including the metal foil 3, drying it, and curing it as necessary, though not shown, and then form the base opening 6 by laser processing, punching, or the like, as shown in FIG. 3(d).

The formation of the second insulating base layer 5 and the base opening 6 is not limited thereto. For example, it is also possible to form the second insulating base layer 5 first by preliminarily forming a synthetic resin into a film in a pattern in which the base opening 6 is not formed and stick the film to the upper surface of the first insulating base layer 4 via a known adhesive layer to cover the metal foil 3, though not shown, and then form the base opening 6 by laser processing, punching, or the like, as shown in FIG. 3(d).

As a result, the second insulating base layer 5 and the base opening 6 can be formed separately in two steps.

Next, as shown in FIG. 3(e), the conductive pattern 7 is formed on the upper surface of the second insulating base layer 5.

The conductive pattern 7 is formed by a patterning method such as, e.g., an additive method or a subtractive method. Preferably, the conductive pattern 7 is formed by the additive method.

In the additive method, a second metal thin film 22 indicated by the dotted line is formed first on the upper, surface of the second insulating base layer 5 including the metal foil 3 exposed from the base opening 6. The second metal thin film 22 is formed by any of the same methods as those used to form a first metal thin film 21. Preferably, the second metal thin film 22 is formed by successively laminating a chromium thin film and a copper thin film by chromium sputtering and copper sputtering.

Next, a dry film resist is provided on the surface of the second metal thin film 22, exposed to light, and developed to form a plating resist, not shown, in a pattern reverse to the wired circuit pattern. Then, the conductive pattern 7 is formed by plating in a pattern integrally including the wires 8, the terminal portions 10, and the plating leads 9 (see FIG. 1) on the surface of the second metal thin film 22 exposed from the plating resist. Subsequently, the plating resist and the portion of the second metal thin film 22 where the plating resist is formed are removed by etching or the like. The plating may be either electrolytic plating or, electroless plating. However, electrolytic plating is preferably used, or more preferably, electrolytic copper plating is used.

Next, as shown in FIG. 4(f), the insulating cover layer 11 is formed on the second insulating base layer 5 to cover the conductive pattern 7 and expose the terminal portions 10 and the metal foil 3 exposed from the base opening 6.

The insulating cover layer 11 is formed in a pattern in which the terminal portions 10 and the metal foil 3 exposed from the base opening 6 are exposed by, e.g., uniformly coating a solution (varnish) of the photosensitive synthetic resin mentioned above on the upper surface of the second insulating base layer 5 including the metal foil 3 exposed from the base opening 6 to cover the conductive pattern 7, drying it, exposing it to light via a photomask, developing it, and then curing it as necessary.

The formation of the insulating cover layer 11 is not limited thereto. For example, it is also possible to preliminarily form a synthetic resin into a film in the foregoing pattern (in which the cover openings 12 are formed) and then stick the film to the upper surface of the second insulating base layer 5 via a known adhesive layer to cover the conductive pattern 7.

Alternatively, it is also possible to form the insulating cover layer 11 first by, e.g., uniformly coating a solution (varnish) of the synthetic resin shown above on the upper surface of the second insulating base layer 5, drying it, and curing it as necessary, though not shown, and then form the cover openings 12 by laser processing, punching, or the like, as shown in FIG. 4(f).

The formation of the insulating cover layer 11 and the cover opening 12 is not limited thereto. For example, it is also possible to form the insulating cover layer 11 first by preliminarily forming a synthetic resin into a film in a pattern in which the cover openings 12 are not formed and sticking the film to the upper surface of the second insulating base layer 5 via a known adhesive layer to cover the conductive pattern 7, though not shown, and then form the cover openings 12 by laser processing, punching, or the like, as shown in FIG. 4(f).

Next, as shown in FIG. 4(g), the perforation 17 is formed in the respective portions of the metal supporting board 2, the first insulating base layer 4, the metal foil 3, and the second insulating base layer 5 located between the main body portion 15 and the removal portion 16.

The perforation 17 is formed using an infrared laser or a UV laser or by a known method such as die-punching. Preferably, the perforation 17 is formed by an ablation method using a UV laser.

Next, as shown in FIG. 4(h), the electrolytic plating layer 13 is formed on the surface of each of the terminal portions 10.

The electrolytic plating layer 13 is formed by electrolytic plating in which the wired circuit board 1 in a process of the production shown in FIG. 4(g) is dipped in a plating solution of any of the metals shown above and electricity is supplied from the plating lead connection terminal, not shown, to cause conduction in the wired circuit board 1 via the plating leads 9.

When a pin hole 20 is formed in the second insulating base layer 5 formed under the wires 8 to extend therethrough in the thickness direction, the conductive material forming the conductive pattern 7 is filled in the pin hole 20 during the formation of the conductive pattern 7 to cause conduction between the metal foil 3 and the conductive pattern 7. As a result, the electrolytic plating layer 13 is formed also on the surface of the metal foil 3 exposed from the base opening 6 by the electrolytic plating described above, as shown in FIG. 5.

When the pin hole 20 mentioned above is riot formed, the metal foil 3 and the conductive pattern 7 are not conducted. As a result, the electrolytic plating layer 13 is not formed on the surface of the metal foil 3 exposed from the base opening 6 even by the electrolytic plating described. above.

When the metal foil 3 and the conductive pattern 7 are conducted, e.g., when the pin hole 20 is formed in the second insulating base layer 5 formed under at least any one of the wires 8 to extend therethrough in the thickness direction (the solid line of FIG. 5 shows an embodiment in which the pin hole 20 is formed in the second insulating base layer 5 located under the one widthwise outermost wire 8) as shown in FIG. 5, the electric properties of the wire 8 change due to the conduction with the metal foil 3. When not only one, but the plurality of pin holes 20 are formed in the second insulating base layer 5 formed under the plurality of wires 8 as indicated by the dotted lines in FIGS. 1 and 5 (the dotted lines of FIG. 1 show an embodiment in which the four pin holes 20 are formed in the second insulating base layer 5 located under all the four respective wires 8), each of the wires 8 is short-circuited via the metal foil 3 in addition to the changes in electric properties mentioned above.

Thereafter, conduction between the metal foil 3 and the conductive pattern 7 is inspected in the method by determining whether or not the electrolytic plating layer 13 is formed on the surface of the metal foil 3 exposed from the base opening 6.

Whether or not the electrolytic plating layer 13 is formed on the surface of the metal foil 3 exposed from the base opening 6 is determined by, e.g., appearance observation (visual observation) such as macroscopic observation or microscopic (optical microscopic) observation or by, e.g., surface analysis such as X-ray electron spectroscopy. Preferably, the formation of the electrolytic plating layer 13 is determined by appearance observation such as microscopic observation.

When the inspection can confirm that the electrolytic plating layer 13 is formed on the surface of the metal foil 3 exposed from the base opening 6, the wired circuit board 1 is determined as a defective product in assuming that the metal foil 3 and the conductive pattern 7 are conducted. Conversely, when the inspection can confirm that the electrolytic plating layer 13 is not formed on the surface of the metal foil 3 exposed from the base opening 6, the wired circuit board 1 is determined as a non-defective product in assuming that the metal foil 3 and the conductive pattern 7 are not conducted.

Thereafter, the removal portion 16 in which the metal leads 9 and the base opening 6 are formed is removed from the main body portion 15 in which the wires 8 and the terminal portions 10 are provided by a folding or tear-off operation along the perforation 17, though not shown.

Thus, in accordance with the method for producing the wired circuit board 1, conduction between the metal foil 3 and the conductive pattern 7 can be easily inspected by forming the electrolytic plating layer 13 on the surface of each of the terminal portions 10 and then determining whether or not the electrolytic plating layer 13 is formed on the surface of the metal foil 3 exposed from the base opening 6 in a manner as described above. This allows easy and reliable screening of the defective wired circuit board 1.

In the method, the electrolytic plating layer 13 is formed on the surface of each of the terminal portions 10 and, when the metal foil 3 and the conductive pattern 7 are conducted, the electrolytic plating layer 13 is formed also on the surface of the metal foil 3 exposed from the base opening 6, as shown in FIG. 5.

As a result, the electrolytic plating layer 13 at each of the terminal portions 10 and the electrolytic plating layer 13 for inspection in the base opening 6 can be formed simultaneously in one step. This allows easy production of the wired circuit board 1, while inspecting conduction between the metal foil 3 and the conductive pattern 7.

Additionally, in the method, the insulating cover layer 11 is formed on the second insulating base layer 5 to cover the wires 8 and the plating leads 9 and to expose the terminal portions 10 and the metal foil 3 exposed from the base opening 6 of the second insulating base layer 5. This allows reliable formation of the electrolytic plating layer 13 on the surface of each of the terminal portions 10 and reliable formation of the electrolytic plating layer 13 for inspection in the base opening 6 in the case of conduction between the metal foil 3 and the conductive pattern 7.

Moreover, in the method, the removal portion 16 in which the plating leads 9 and the base opening 6 are formed is removed along the perforation 17 from the main body portion 15 in which the wires 8 and the terminal portions 10 are provided.

This removes the plating leads 9 and allows the wires 8 to be electrically independent of each other in the main body portion 15.

When the wired circuit board 1 is determined as a non-defective product, the electrolytic plating layer 13 is not formed in the base opening 6 of the second insulating base layer 5. As a result, the metal foil 3 is exposed from the base opening 6 of the second insulating base layer 5 to possibly cause the corrosion of the metal foil 3. Even in such a case, the possibility of such corrosion of the metal foil 3 can be avoided by removing the removal portion 16 from the main body portion 15.

As a result, the wired circuit board 1 can be obtained that is determined as a non-defective product having excellent in long-term reliability.

Figure 6:
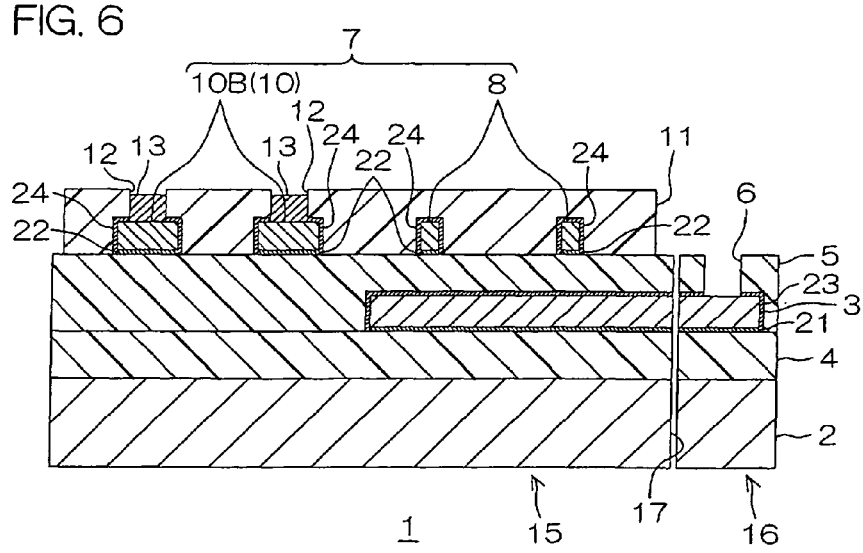
FIG. 6 is a cross-sectional view of a wired circuit board according to another embodiment of the present invention, which corresponds to FIG. 2.

FIG. 6 is a cross-sectional view of a wired circuit board according to another embodiment of the present invention, which corresponds to FIG. 2. As for members corresponding to the individual components described above, the detailed description thereof is omitted by using the same reference numerals in FIG. 6.

In the description given above, the metal foil 3 is formed integrally with the first metal thin film 21 (see FIG. 4(h)). However, the present invention is not limited thereto. For example, as shown in FIG. 6, it is also possible to form the metal foil 3 distinctly from the first metal thin film 21.

In the wired circuit board 1 of FIG. 6, the first metal thin film 21 is formed to be interposed between the metal foil 3 and the first insulating base layer 4.

To form the first metal thin film 21 and the metal foil 3 distinctly from each other, a metal material different from that used to form the metal foil 3 may be used to form the first metal thin film 21. Preferably, the first metal thin film 21 is formed of only chromium and the metal foil 3 is formed. of only copper.

In the foregoing description of the wired circuit board 1 shown in FIG. 2, the second insulating base layer 5 is formed directly to cover the metal foil 3. However, the present invention is not limited thereto. For example, as shown in FIG. 6, it is also possible to form a third metal thin film 23 on the surface of the metal foil 3 and form the second insulating base layer 5 to cover the third metal thin film 23.

Examples of a metal material used to form the third metal thin film 23 include nickel, chromium, and an alloy of nickel and chromium (nichrome). Preferably, nickel is used to form the third metal thin film 23.

The third metal thin film 23 is formed by sputtering, electrolytic plating, electroless plating, or the like. Preferably, the third metal thin film 23 is formed by electroless nickel plating.

The third metal thin film 23 exposed from the base opening 6 of the second insulating base layer 5 is removed by laser processing, punching, or the like simultaneously with or after the formation of the base opening 6.

In the foregoing description of the wired circuit board 1 shown in FIG. 2, the insulating cover layer 11 is formed directly to cover the conductive pattern 7. However, the present invention is not limited thereto. For example, as shown in FIG. 6, it is also possible to form a fourth metal thin film 24 on the surface of the conductive pattern 7 and form the insulating cover layer 11 to cover the fourth metal thin film 24.

As a metal material for forming the fourth metal thin film 24, any of the same metal materials is used as those used to form the third metal thin film 23 mentioned above. The fourth metal thin film 24 is formed by any of the same methods as those used to form the third metal thin film 23. Preferably, the fourth metal thin film 24 is formed by electroless nickel plating.

The fourth metal thin film 24 formed on the upper surface of each of the terminal portions 10 exposed from the cover openings 12 of the insulating cover layer 11 is removed by laser processing, punching, or the like simultaneously with or after the formation of the cover openings 12.

In the foregoing description of the wired circuit board 1 shown in FIG. 1, the base opening 6 is formed in a generally rectangular shape when viewed in plan view. However, the shape of the base opening 6 is not limited thereto. For example, it is also possible to form the base opening 6 in an appropriate shape such as a triangular shape or a generally circular plan shape when viewed in plan view, though not shown.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A method for producing a wired circuit board, the method comprising the steps of:
   preparing a metal supporting board;
   forming a metal foil on the metal supporting board;
   forming an insulating base layer on the metal supporting board to cover the metal foil;
   forming an opening in the insulating base layer to expose the metal foil;
   forming a conductive pattern having a terminal portion on the insulating base layer;
   forming an electrolytic plating layer on a surface of the terminal portion by electrolytic plating; and,
   determining whether or not the electrolytic plating layer is formed on a surface of the metal foil exposed from the opening after forming the electrolytic plating layer to inspect conduction between the metal foil and the conductive pattern.

2. The method according to claim 1, further comprising the step of:
   forming an insulating cover layer on the insulating base layer to cover the conductive pattern and expose the terminal portion and the metal foil exposed from the opening.

3. The method according to claim 1, further comprising the step of:
   forming a perforation between a main body portion in which the terminal portion is provided and a removal portion which can be removed from the main body portion and in which the opening is formed.

* * * * *